US008040286B2

(12) United States Patent
Matsuo et al.

(10) Patent No.: US 8,040,286 B2
(45) Date of Patent: Oct. 18, 2011

(54) HIGH FREQUENCY MODULE (75) Inventors: Koichi Matsuo, Tokyo (JP); Kazuyoshi Inami, Tokyo (JP); Mamoru Yoshida, Tokyo (JP); Takeshi Sueda, Tokyo (JP); Shigeo Udagawa, Tokyo (JP); Susumu Sato, Tokyo (JP); Tsutomu Tamaki, Tokyo (JP); Takuya Suzuki, Tokyo (JP); Kousuke Yasooka, Tokyo (JP); Minoru Hashimoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 498 days.

(21) Appl. No.: 12/158,088

(22) PCT Filed: Feb. 1, 2007

(86) PCT No.: PCT/JP2007/051660
§ 371 (c)(1),
(2), (4) Date: Jun. 19, 2008

(87) PCT Pub. No.: WO2007/091470
PCT Pub. Date: Aug. 16, 2007

(65) Prior Publication Data
US 2009/0079648 A1 Mar. 26, 2009

(30) Foreign Application Priority Data
Feb. 6, 2006 (JP) ................................. 2006-028084

(51) Int. Cl.
*H01Q 13/10* (2006.01)
(52) U.S. Cl. ........................................................ 343/771
(58) Field of Classification Search .................. 343/771, 343/700, 767, 850, 853, 770
See application file for complete search history.

(56) References Cited

U.S. PATENT DOCUMENTS

| 6,127,985 | A | 10/2000 | Guler |
| 6,535,173 | B2* | 3/2003 | Ou .............................. 343/770 |
| 6,727,860 | B1 | 4/2004 | Svensson et al. |
| 6,861,996 | B2* | 3/2005 | Jeong ........................... 343/770 |
| 6,870,438 | B1 | 3/2005 | Shino et al. |
| 2002/0101385 | A1* | 8/2002 | Huor ............................ 343/770 |
| 2008/0228063 | A1* | 9/2008 | Turner et al. .................. 600/411 |

FOREIGN PATENT DOCUMENTS

| EP | 1 274 149 | A2 | 1/2003 |
| EP | 1 274 149 | A3 | 1/2003 |
| JP | 62 210704 | | 9/1987 |
| JP | 3 66214 | | 6/1991 |
| JP | 5 3405 | | 1/1993 |
| JP | 5 6921 | | 1/1993 |
| JP | 5 235618 | | 9/1993 |
| JP | 5 506759 | | 9/1993 |
| JP | 7 106843 | | 4/1995 |
| JP | 7 106847 | | 4/1995 |

(Continued)

*Primary Examiner* — Michael C Wimer
(74) *Attorney, Agent, or Firm* — Oblon, Spivak, McClelland, Maier & Neustadt, L.L.P.

(57) ABSTRACT

A high-frequency module has an antenna configured by integrally connecting a slot plate laid out with radiation slots to a plate having plural thin plates formed with a waveguide for supplying power to the slot plate, using a diffusion bonding. The waveguide of the antenna is connected to a dielectric waveguide of a high-frequency package via a waveguide provided on a resin substrate, thereby configuring a slot antenna at low cost, and connecting a power-supply slot of the slot antenna to a waveguide terminal of the high-frequency package with low loss.

5 Claims, 8 Drawing Sheets

FOREIGN PATENT DOCUMENTS

| | | |
|---|---|---|
| JP | 10 313214 | 11/1998 |
| JP | 11 344537 | 12/1999 |
| JP | 2000 236213 | 8/2000 |
| JP | 2000 261239 | 9/2000 |
| JP | 2001 144512 | 5/2001 |
| JP | 2002-16408 | 1/2002 |
| JP | 2002 223115 | 8/2002 |
| JP | 3428575 | 5/2003 |
| JP | 2003 318642 | 11/2003 |
| JP | 2004 88504 | 3/2004 |
| JP | 3531609 | 3/2004 |
| JP | 2004-172688 | 6/2004 |
| JP | 2004 526368 | 8/2004 |
| JP | 3631667 | 12/2004 |
| JP | 2005 217865 | 8/2005 |
| WO | WO 01/04993 A1 | 1/2001 |
| WO | WO 01/18901 * | 3/2001 |
| WO | WO 03/098742 A1 | 11/2003 |

\* cited by examiner

HIGH FREQUENCY MODULE

TECHNICAL FIELD

The present invention relates to a high-frequency module having a high-frequency package, including a waveguide terminal for inputting and outputting a milliwave-band high-frequency signal, connected to a slot antenna.

BACKGROUND ART

Conventionally, there has been known a waveguide slot array antenna including a combination of plural waveguide subarrays (for example, see Patent Document 1). This type of waveguide slot array antenna is assembled by adhering plural individually-molded waveguide subarrays to each other in the nature of its structure. Therefore, productivity has been extremely poor.

On the other hand, as a method of manufacturing a slot antenna, there is known a technique of integrally connecting a slot plate to a substrate formed with waveguide trenches, by diffusion bonding (for example, see Patent Document 2).

Patent Document 1: Japanese Patent Application Laid-open No. 2000-236213

Patent Document 2: Japanese Patent Application Laid-open No. H10-313214

DISCLOSURE OF INVENTION

Problem to be Solved by the Invention

When a slot array antenna is structured using a manufacturing technique of diffusion bonding, a high-frequency module can be expected to be produced at low cost.

However, when a slot antenna is connected to a high-frequency package operating in a milliwave band smaller than the size of an antenna opening surface, an interval between waveguide terminals for transmission or reception of a high-frequency package is smaller than the interval between power supply slots of the slot antenna. Because the layouts are different, a mismatch occurs in the connection size.

A slot antenna in the Patent Document 2 has a simple structure of only connecting a slot plate provided on a radiation slot to a sidewall provided with a trench. Plural power supply slots provided on the substrate are laid out in the same length as the length of the antenna opening. Therefore, in the structure of the Patent Document 2, the waveguide terminals for transmission or reception of a high-frequency package are difficult to be connected to the power supply slots of the slot antenna.

At the time of connecting a high-frequency package waveguide terminal to the power supply slot of a slot antenna, a signal propagation loss of the connection path needs to be minimized. The Patent Document 2 does not disclose a detailed connection structure.

The present invention has been achieved in view of the above problems, and an object of the invention is to obtain a high-frequency module capable of connecting a radiation slot of a slot antenna to a high-frequency package waveguide terminal with low loss as well as configuring the slot antenna at low cost.

Means for Solving Problem

A high-frequency module according to an aspect of the present invention includes an antenna including a slot plate laid out with a plurality of radiation slots, a radiation waveguide plate in contact with the slot plate and formed with a plurality of rows of waveguide trenches having layout directions of the radiation slots set in respective pipe axis directions, a power-supply slot plate in contact with the radiation waveguide plate and formed with a plurality of power supply slots connected to the waveguide trenches, a power-supply waveguide plate in contact with the power-supply slot plate and formed with a plurality of waveguides connected to the power-supply slots, and a power supply plate in contact with the power-supply waveguide plate and formed with a plurality of waveguide openings connected to the waveguides, and having the plates integrally connected to configure a slot antenna; a resin substrate fixed to the power-supply plate surface of the antenna, having a plurality of waveguide openings communicated to the waveguide openings of the antenna, and mounted with conductor terminals, ground conductors, and electronic parts; and a high-frequency package including a dielectric substrate mounted with a high-frequency semiconductor element, and a lid unit accommodating the dielectric substrate and the high-frequency semiconductor element, and connected to the resin substrate via a plurality of conductive connection members. The high-frequency package includes a conductor terminal, and a ground conductor, and a waveguide terminal formed with a dielectric opening in a ground conductor, at the outside of the package, the waveguide terminal and the high-frequency signal terminal of the high-frequency semiconductor element being connected to each other via a dielectric waveguide, the waveguide terminal of the high-frequency package and the waveguide opening of the resin substrate are laid out to face each other, the plurality of conductive connection members are laid out to surround the waveguide terminal of the high-frequency package and the waveguide openings of the resin substrate, and connect the conductor terminal and the ground terminal of the high-frequency package to the conductor terminal and the ground terminal of the resin substrate, and the conductive connection members have at least a plurality of rows laid out including rows surrounding in a ring shape the waveguide terminals of the high-frequency package and rows laid out in a ring shape along the outer periphery of the high-frequency package.

A high-frequency module according to another aspect of the present invention includes an antenna including a slot plate laid out with a plurality of radiation slots, a radiation waveguide plate in contact with the slot plate and formed with a plurality of rows of waveguide trenches having layout directions of the radiation slots set in respective pipe axis directions, a power-supply slot plate in contact with the radiation waveguide plate and formed with a plurality of power supply slots connected to the waveguide trenches, a power-supply waveguide plate in contact with the power-supply slot plate and formed with a plurality of waveguides connected to the power-supply slots, and a power supply plate in contact with the power-supply waveguide plate and formed with a plurality of waveguides openings connected to the waveguides, a slot antenna being configured by integrally connecting the plates; a waveguide plate having one direction thereof closely fixed to the front surface of the power supply plate of the antenna, and having a plurality of waveguides communicating with the waveguide openings of the antenna; a resin substrate fixed to the other direction of the waveguide plate, having a plurality of waveguide openings communicated with the waveguides of the waveguide plate, and mounted with conductor terminals, ground conductors, and electronic parts; and a high-frequency package including a dielectric substrate mounted with a high-frequency semiconductor element, and a lid unit accommodating the dielectric substrate and the high-frequency semiconductor element, and connected to the resin substrate via a plurality of conductive connection members. The high-frequency package includes a conductor terminal, and a ground conductor, and a waveguide terminal formed with a dielectric opening in a ground conductor, at the outside of the package, and has the waveguide terminal and the high-frequency signal terminal of the high-frequency semiconductor element connected to each other via a dielectric waveguide, the waveguide terminal of the high-frequency package and the waveguide opening of the resin substrate are laid out to face each other, the plurality of conductive connection members are laid out to surround the waveguide terminal of the high-frequency package and the waveguide openings of the resin substrate, and connect the conductor terminal and the ground terminal of the high-frequency package to the conductor terminal and the ground terminal of the resin substrate, and the conductive connection members have at least a plurality of rows laid out including rows surrounding in a ring shape the waveguide terminals of the high-frequency package and rows laid out in a ring shape along the outer periphery of the high-frequency package.

Effect of the Invention

According to the present invention, a high-frequency module connecting a radiation slot of a slot antenna to a waveguide terminal of a high-frequency package with a waveguide can be produced at lower cost. Further, a connection loss between the radiation slot of the slot antenna and the waveguide terminal of the high-frequency package can be further decreased.

EXPLANATIONS OF LETTERS OR NUMERALS

1 High-frequency module
2 High-frequency package
3 Electronic part
4 Resin substrate
5 Antenna
6, 7 Screw
10 Radiation slot for transmission
11 Radiation slot for reception
20 Dielectric multilayer substrate
23 Strip conductor line
30 Dielectric waveguide
31, 32 Conductive connection member
33 Waveguide terminal
39 Waveguide
53 Power supply plate
54 Power-supply waveguide plate
55 Power-supply slot plate
56 Radiation waveguide plate
57 Slot plate
61 Waveguide
62 Waveguide trench
63 Power supply slot
64 Power-supply waveguide trench
65 Power supply slot
66 Radiation waveguide trench
73 Choke trench
74, 75 Screw hole

BEST MODE(S) FOR CARRYING OUT THE INVENTION

Exemplary embodiments of a high-frequency module according to the present invention will be explained below in detail with reference to the accompanying drawings. Note that the invention is not limited to the embodiments.

Figure 1A:
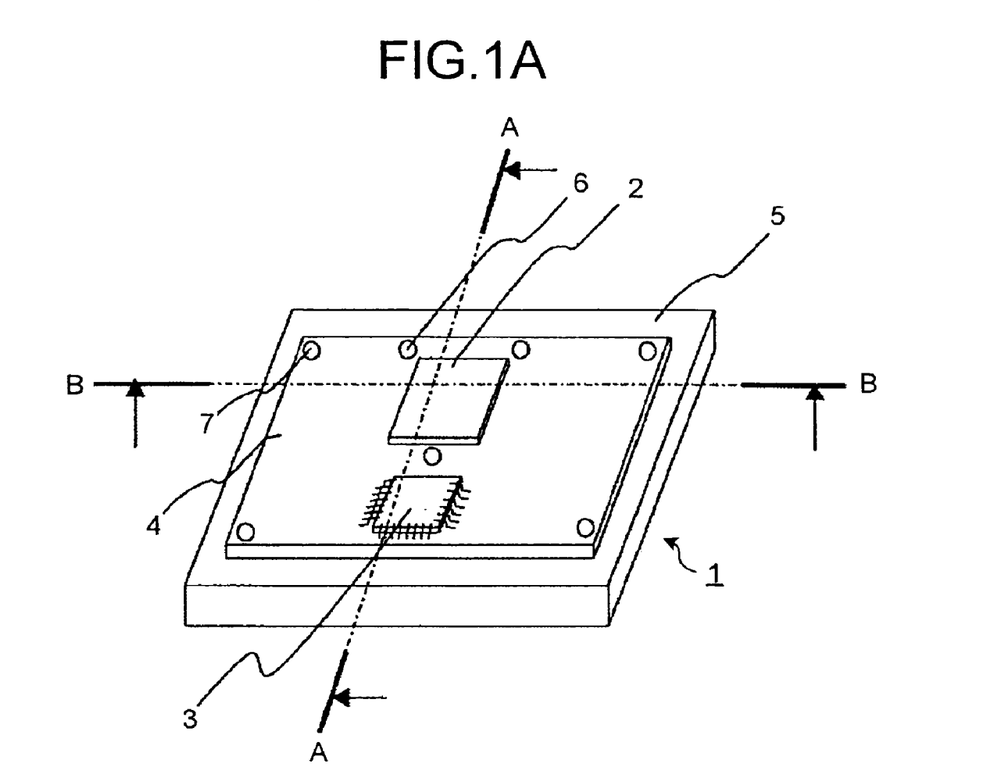
FIGS. 1A and 1B are perspective views of a high-frequency module according to an embodiment of the present invention.
Figure 1B:
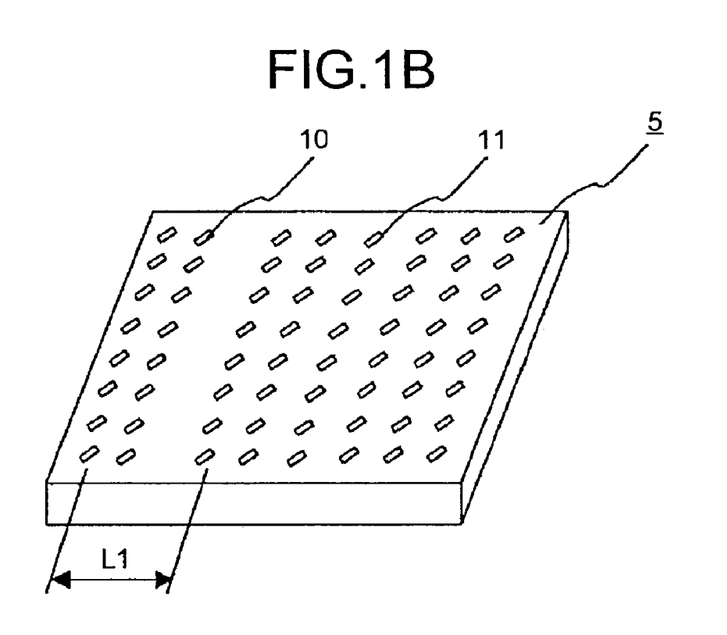

FIGS. 1A and 1B are configuration views of a high-frequency module according to the embodiment of the present invention, where FIG. 1A is a perspective view of a front surface, and FIG. 1B is a perspective view of a rear surface.

FIGS. 1A and 1B, a high-frequency module 1 includes a high-frequency package 2, an electronic part 3, a resin substrate 4, and a plate-shaped antenna 5. The high-frequency package 2 and the electronic part 3 are mounted on the resin substrate 4. The resin substrate 4 is closely fixed to the antenna 5 with screws 6 and 7. The antenna 5 is provided with plural radiation slots 10 for transmission, and plural radiation slots 11 for reception. The radiation slots 10 and 11 constitute a slot antenna. L1 designates an interval between the transmission radiation slot 10 and the reception radiation slot 11.

Figure 2A:
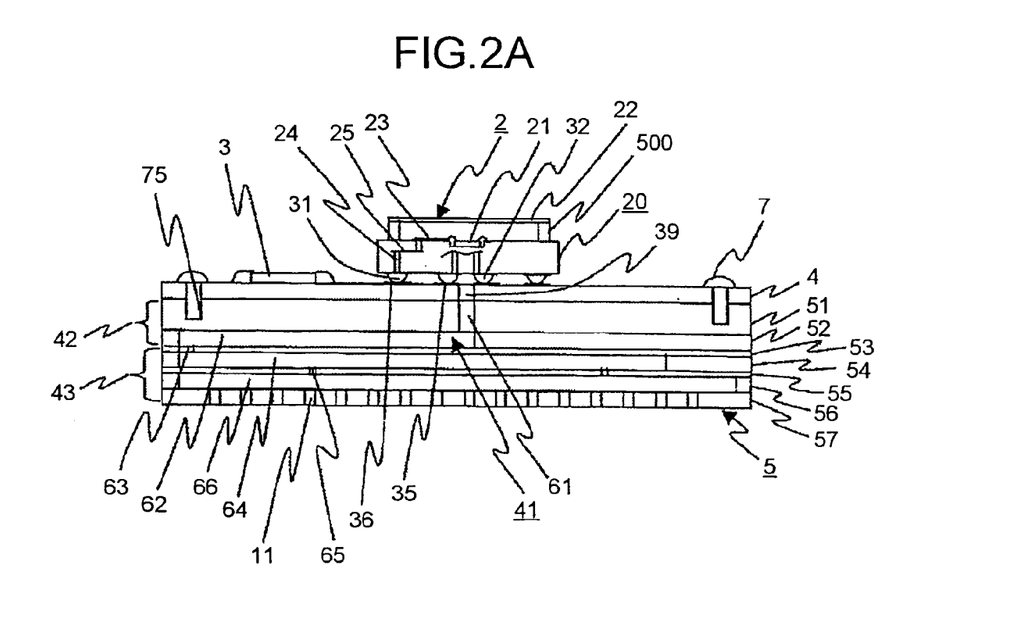
FIGS. 2A and 2B are cross-sectional views of a structure of the high-frequency module according to the embodiment of the present invention.
Figure 2B:
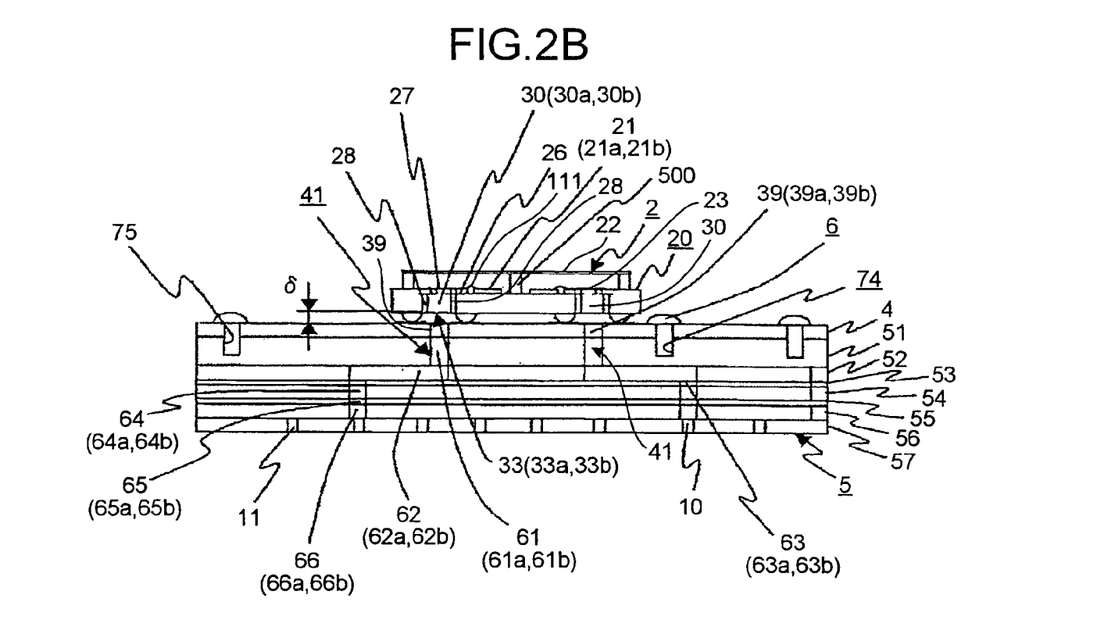

FIGS. 2A and 2B are cross-sectional views of the high-frequency module 1, where FIG. 2A is a cross-sectional view along A-A of FIG. 1A, and FIG. 2B is a cross-sectional view along B-B of FIG. 1B. FIGS. 3A to 3D are exploded perspective views of plates 54 to 57 constituting the antenna 5. FIGS. 4A to 4D are exploded perspective views of plates 51 to 53 constituting the antenna 5. FIGS. 3A to 3D and FIGS. 4A to 4C are perspective views of the upper surface, and FIG. 4D is a perspective view of the lower surface (rear surface).

Figure 5A:
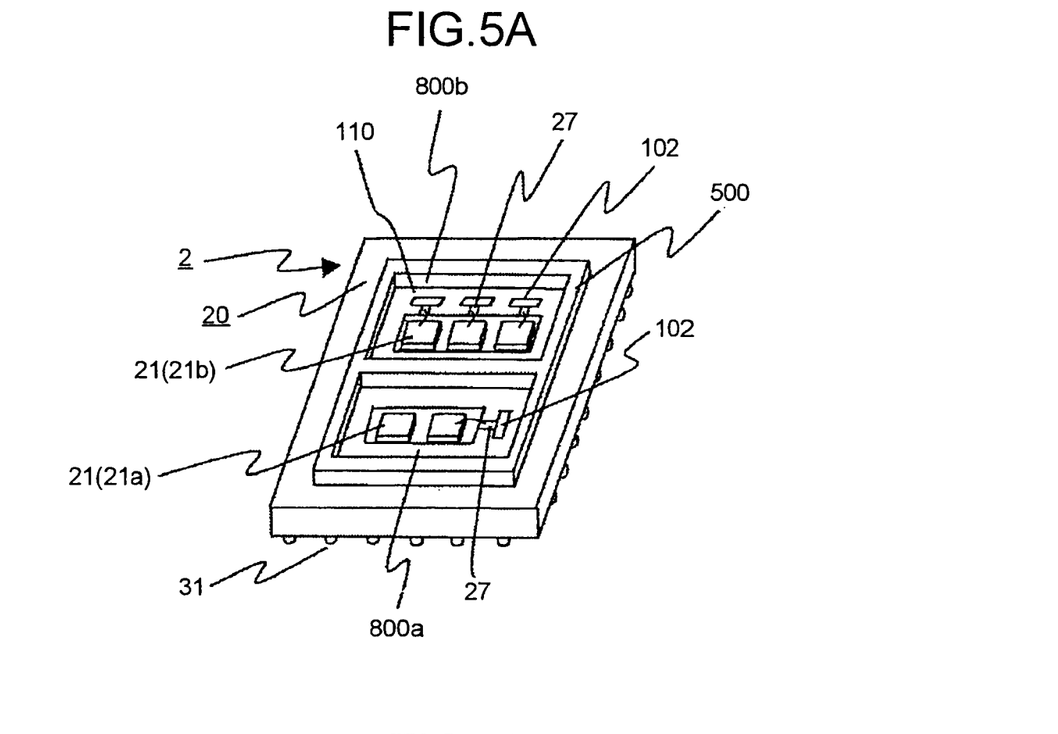
FIGS. 5A and 5B show structures of each unit of a high-frequency package according to the embodiment of the present invention.

In these drawings, in the high-frequency package 2, semiconductor chips 21 (21a, 21b) are mounted by being accommodated in a cavity 110 provided on the upper surface of a dielectric multilayer substrate 20 (see FIG. 5A). The semiconductor chips 21 include semiconductor elements of transistors and diodes using gallium arsenide (GaAs) excellent in high-frequency characteristic, a MMIC (Monolithic Microwave Integrated Circuit) having integrated receiving elements such as semiconductors, capacitors, inductors, and filter circuits, and chip capacitors. The upper side of the cavity of the dielectric multilayer substrate 20 accommodating the semiconductor chips 21 is covered with a lid unit 22 including a metal plate and a conductor such as a ceramic sintered compact having the front surface covered with a conductor. The lid unit 22 is hermetically connected to a metal frame (seal ring) 500 connected to the upper surface of the dielectric multilayer substrate 20, by seam welding or silver wax.

The dielectric multilayer substrate 20 is provided with a conductor terminal and a strip conductor line 23 on the surface layer, and is provided with a conductor via (VIA) 24 and a strip conductor line 25 on the inner layer, thereby constituting a signal transmission line. The surface layer and the inner layer are provided with a ground conductor 26 and ground conductors vias 28, so that the ground conductor vias 28 (28a, 28b, 28c) constitute a dielectric waveguide 30.

An opening exposed with a dielectric substance is provided on a ground conductor on the lower surface of the dielectric multilayer substrate 20, thereby constituting waveguide terminals 33 as input and an output terminals of the dielectric waveguide 30. The dielectric waveguide 30 is connected to a microstrip line (high-frequency transmission line) 27 for transmitting a high-frequency signal of a milliwave band on the upper surface of the dielectric multilayer substrate 20, thereby constituting a microstrip-line waveguide converter. The microstrip line 27 is connected to a conductor terminal on the semiconductor chip 21 via a conductive wire 111.

The dielectric multilayer substrate 20 includes a multilayer ceramic substrate, configured by laminating ceramic plates in a multilayer having a pattern formed by coating a conductive paste, and having a conductive paste filled in the through-hole, and sintered, or by laminating and connecting thin-film ceramic substrates.

Conductive connection members 31 and 32 such as a spherical or barrel-type solder bump (solder ball) and gold bump are connected to the lower surface (rear surface) of the dielectric multilayer substrate 20, thereby constituting a BGA (ball grid array). Plural conductive connection members 31 are laid out in a ring shape along a periphery of the lower surface of the dielectric multilayer substrate 20, and are connected to the conductor via 24. Plural conductive connection members 32 are laid out in a ring shape to surround a periphery of the waveguide terminals 33 of the dielectric waveguide 30 (see FIG. 5B).

The dielectric multilayer substrate 20 constituting the high-frequency package 2 is grounded to the ground conductor 35 on the upper surface of the resin substrate 4 via the conductive connection members 32. The dielectric multilayer substrate 20 is connected to a conductor terminal 36 on the upper surface of the resin substrate 4 via the conductive connection members 31. The conductor terminal 36 is electrically connected to the electronic part 3 laid out on the resin substrate 4. A gap 6 is formed between the lower surface of the dielectric multilayer substrate 20 and the upper surface of the resin substrate 4. A resin underfill can be configured by filling a nonconductive resin connection agent into the gap 6. However, in this case, the resin underfill is filled into an outer periphery of the dielectric multilayer substrate 20 so that the resin underfill is not protruded to the inside of the ring-shaped array of the conductive connection members 32. Accordingly, mechanical strength of the connection part between the dielectric multilayer substrate 20 and the resin substrate 4 can be reinforced.

When the high-frequency package 2 is connected to the resin substrate 4 using a solder bump in the conductive connection members 31 and 32 constituting the ball grid array, the high-frequency package 2 can be positioned to the resin substrate 4 in high precision due to the self-alignment effect of the solder bump. Therefore, the dielectric waveguide 30 of the high-frequency package 2 can be positioned in high precision with a waveguide 39 of the resin substrate 4.

The resin substrate 4 is formed with a rectangular or elliptical opening, and a conductor layer is formed on the inner periphery of the opening and the edge periphery of the opening to constitute the waveguide 39. Instead of providing a conductor layer on the inner periphery of the opening of the waveguide 39, plural conductive through-holes can be laid out at predetermined intervals on the periphery of the opening, thereby constituting an electromagnetic shield wall. The waveguide terminals 33 of the dielectric multilayer substrate 20 are electrically connected to the waveguide 39 of the resin substrate 4. The resin substrate 4 is configured by a glass epoxy substrate or the like.

The lower surface (rear surface) of the resin substrate 4 is directly connected to the upper surface, and the waveguide 39 is connected to a waveguide 41 provided inside the antenna 5, thereby connecting the waveguide 39 and the waveguide 41 with each other. The screws 6 and 7 are inserted in the resin substrate 4 via through-holes formed thereon. The screws 6 and 7 are engaged with screw holes (female screws) 74 and 75 formed on the antenna 5, thereby fastening the resin substrate 4 to the antenna 5. The antenna 5 includes a waveguide interface unit (waveguide plate) 42 made of a metal conductor and an antenna unit 43.

The waveguide interface unit 42 includes: a first waveguide plate 51 having a thickness of about 2 to 5 millimeters (a thickness on which a screw hole can be formed) formed with screw holes 74 and 75 to fix the resin substrate 4; and a second waveguide plate 52 of a thin plate having a thickness of 0.5 to 1 millimeter (a thickness on which a waveguide and a slot hole can be formed) in contact with the first waveguide plate 51. The first waveguide plate 51 is provided with a rectangular opening in the direction of the plate thickness, and plural waveguides 61 are configured. The second waveguide plate 52 is provided with an opening to form plural waveguide trenches 62. The waveguide 61 is communicated to the waveguide trench 62 to constitute the waveguide 41. The waveguide 61 is directly connected to the waveguide 39. The first waveguide plate 51 and the second waveguide plate 52 are laminated and connected by positioning so that two reference holes 70 provided on each plate are superimposed at the same position of each place.

Figure 2C:
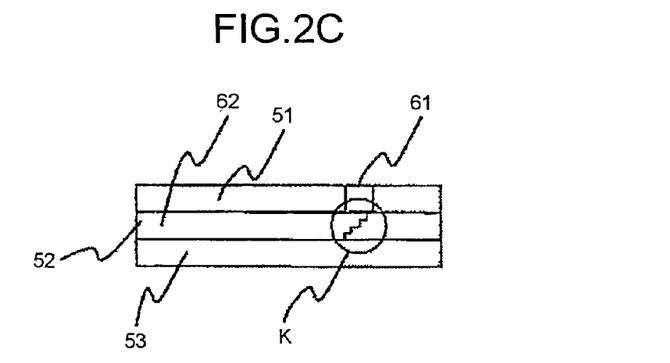
FIG. 2C is a cross-sectional view of other example of a junction between first and second waveguide plates.

The first and second waveguide plates 51 and 52 can be configured by laminating plural thin plates, respectively, and are not limited to one plate, respectively. At the connection part of the first and second waveguide plates 51 and 52, a stepped surface can be formed at a corner of the waveguide by laminating plural plates having different sizes of holes at slight steps at the corner of a connection part between the waveguide 61 and the waveguide trench 62. FIG. 2C is a cross-sectional view of an example that a stepped surface is provided at the corner of the waveguide. As shown in FIG. 2C, at the corner of a portion where the waveguide 61 is connected to the waveguide trench 62, a length of the hole forming the waveguide is sequentially changed in plural plates, and these plates are laminated to constitute the second waveguide plate 52, thereby forming a stepped surface having the length of the hole sequentially changed in the waveguide corner. With this arrangement, propagation loss of the waveguide can be decreased by decreasing reflection at the waveguide corner. Further, instead of providing a stepped surface at the corner, an iris can be provided near the corner to align. In this case, it is not necessary to laminate plural plates to provide a stepped surface. Therefore, the second waveguide plate 52 can be made much thinner. Productivity can be improved while maintaining the reduction effect of transmission loss.

The antenna unit 43 includes the power supply plate 53, the power-supply waveguide plate 54 in contact with the power supply plate 53, the power-supply slot plate 55 in contact with the power-supply waveguide plate 54, the radiation waveguide plate 56 in contact with the power-supply slot plate 55, and the slot plate 57 in contact with the radiation waveguide plate 56. The power supply plate 53, the power-supply waveguide plate 54, the power-supply slot plate 55, the radiation waveguide plate 56, and the slot plate 57 are laminated and connected together by positioning so that the two holes 70 formed on each plate are superimposed together at the same positions. Each plate is a thin plate having a thickness of about 0.1 to 1 millimeter (a thickness on which a waveguide and a slot hole can be formed) having an opening.

The power supply plate 53 is provided with power supply openings 63 (63*a*, 63*b*) having plural rectangular openings. The power-supply waveguide plate 54 is formed with plural power-supply waveguide trenches 64 (64*a*, 64*b*). The power-supply slot plate 55 is provided with power supply slots (holes) 65 (65*a*, 65*b*) having plural rectangular openings. The radiation waveguide plate 56 is formed with radiation waveguide trenches 66 (66*a*, 66*b*). The slot plate 57 is laid out with plural radiation slots 10 and radiation slots 11 having plural rectangular openings.

The power supply openings 63, the power-supply waveguide trenches 64, the power supply slots 65, and the radiation waveguide trenches 66 are continuous with each other to constitute a power supply waveguide, and are connected to the waveguide 41. The radiation waveguide trench 66 (66*a*) is connected to the radiation slot 10. The radiation waveguide trench 66 (66*b*) is connected to the radiation slot 11. At the corner of the connection part of each waveguide, plural plates having slightly different sizes of holes can be laminated in a similar manner to that shown in FIG. 2C, thereby constituting a stepped surface at the corner of the waveguide.

One example of functions and connection mode of each radiation slot, the power supply opening, the waveguide trench, and the waveguide is further explained with reference to the drawings. In the example shown in FIGS. 3A to 3D and 4A to 4D, one transmission channel (transmission port) and three reception channels (transmission ports) are shown. However, the numbers of channels are not limited to the above.

Figures 3A, 3B:
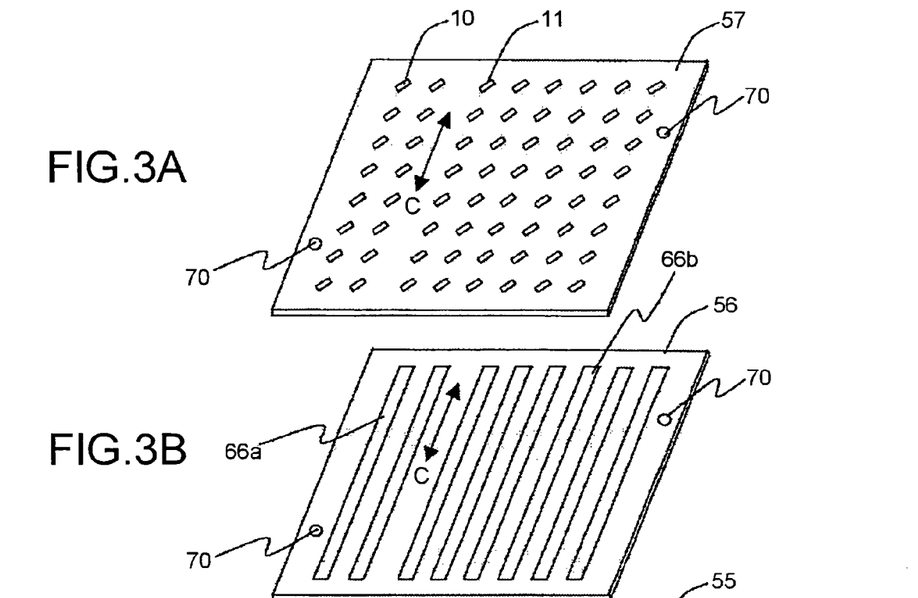
FIGS. 3A to 3D are perspective views of a structure of each plate constituting an antenna of a high-frequency module according to the embodiment of the present invention.

As shown in FIG. 3A, plural (two or more) radiation slots 10 are laid out in series in a state that the opening direction (longitudinal direction) of each radiation slot is inclined by a suitable angle to a pipe axis direction C, thereby constituting a slot row. Slots (slot array) are laid out by one or plural rows to constitute a plane array. Each radiation slot 10 functions as a transmission radiation slot radiating a transmission wave. In the illustrated example, a pair of (two) slot rows correspond to one transmission channel. Because there are two slot rows, these constitute one transmission channel. One set of slot rows can be configured by constituting one subarray with plural radiation slots laid out in series, and arraying these subarrays in series.

Plural (two or more) radiation slots 11 are laid out in series in the tube axis direction C to constitute slot rows in a state that opening directions (longitudinal directions) of the radiation slots are inclined at a suitable angle. Plural (two or more) slot rows are laid out to constitute a plane array. The radiation slot 11 receives the wave returning by reflection from a reflection unit after being transmitted from the radiation slot 10. Therefore, the radiation slot 11 functions as a reception radiation slot. In the illustrated example, a pair of (two) slot rows correspond to one reception channel. Because there are six slot rows, these constitute three receptions channels. One set of slot rows can be configured by constituting one subarray with plural radiation slots laid out in series, and arraying these subarrays in series.

Each radiation slot 10 within the same slot row is electrically connected to one radiation waveguide trench 66*a*. The radiation waveguide trench 66*a* is formed with a trench to pierce through the radiation waveguide plate 56. The axial direction of the radiation waveguide trench 66*a* (longitudinal direction of the axis) coincides with the tube axis direction C in FIG. 3B, and each radiation slot 10 within the same slot row and the radiation waveguide trench 66*a* are laid out to face each other. Plural radiation waveguide trenches 66*a* are laid out in the orthogonal direction of the tube axis direction C, and each slot row of the radiation slot 10 is electrically connected to the radiation waveguide trench 66*a* laid out to face each other.

Each radiation slot 11 within the same slot row is electrically connected to one radiation waveguide trench 66*b*. The radiation waveguide trench 66*b* is formed with a trench to pierce through the radiation waveguide plate 56. The axial direction of the radiation waveguide trench 66*b* (longitudinal direction of the axis) coincides with the tube axis direction C in FIG. 3B, and each radiation slot 11 within the same slot row and the radiation waveguide trench 66*b* are laid out to face each other. Plural radiation waveguide trenches 66*b* are laid out in the orthogonal direction of the tube axis direction C, and each slot row of the radiation slot 11 is electrically connected to the radiation waveguide trench 66*b* laid out to face each other.

Figures 3C, 3D:
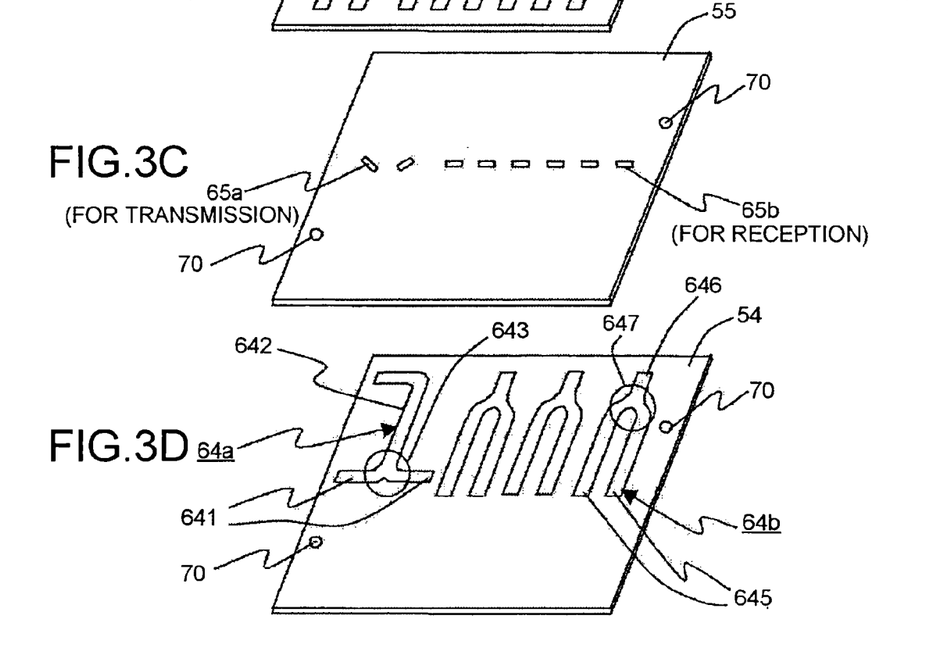

Each power supply slot 65*a* is laid out to face and is electrically connected to each radiation waveguide trench 66*a*. In the example of FIG. 3C, the opening direction (longitudinal direction) of each power supply slot 65*a* is laid out with an inclination at a suitable angle in the pipe axis direction, and a pair of power supply slots 65*a* are laid out in an inverted-V shape corresponding to adjacent pair of radiation waveguide trenches 66*a*. This inclined layout is determined according to a desired grade and polarity of a transmission wave, and is not limited to the illustrate layout example. Each power supply slot 65*b* is laid out to face each radiation waveguide trench 66*b*, and is electrically connected. In the example of FIG. 3C, the opening direction (longitudinal direction) of each power supply slot 65*b* is laid out orthogonally with the pipe axis direction C. This layout is determined according to a desired grade of a received wave, and is not limited to the illustrated layout example.

The power supply slot 65*a* is connected to the power-supply waveguide trench 64*a*. The power-supply waveguide trench 64*a* is formed with a trench to pierce through the power-supply waveguide plate 54. In the example of FIG. 3D, the power-supply waveguide trench 64*a* has a pair of branch trenches 641 branched to two directions in a T shape, and each of the pair of power supply slots 65*a* is connected to each of the pair of branch trenches 641. A longitudinal direction of the branch trenches 641 is orthogonally connected to the radiation waveguide trench 66*a*. A trench 642 is connected to branch to the branch trenches 641 from a branch part 643. That is, a transmission wave propagating the trench 642 is distributed by the branch trenches 641.

The power supply slots 65*b* are connected to the power-supply waveguide trenches 64*b*. The power-supply waveguide trenches 64*b* are formed with trenches to pierce through the power-supply waveguide plate 54. In the example of FIG. 3D, the power-supply waveguide trenches 64*b* form a U shape having a pair of branch trenches 645, and each of an adjacent pair of power supply slots 65*b* is connected to each of a pair of branch trenches 645. A longitudinal direction of the branch trench 645 is laid out orthogonally with the opening direction (longitudinal direction) of the power supply slots 65*b*. The branch trenches 645 are connected to merge trenches 646 from a merge part 647. That is, reception waves propagating through the branch trenches 645 are merged and combined with the trenches 646.

Figures 4A, 4B:
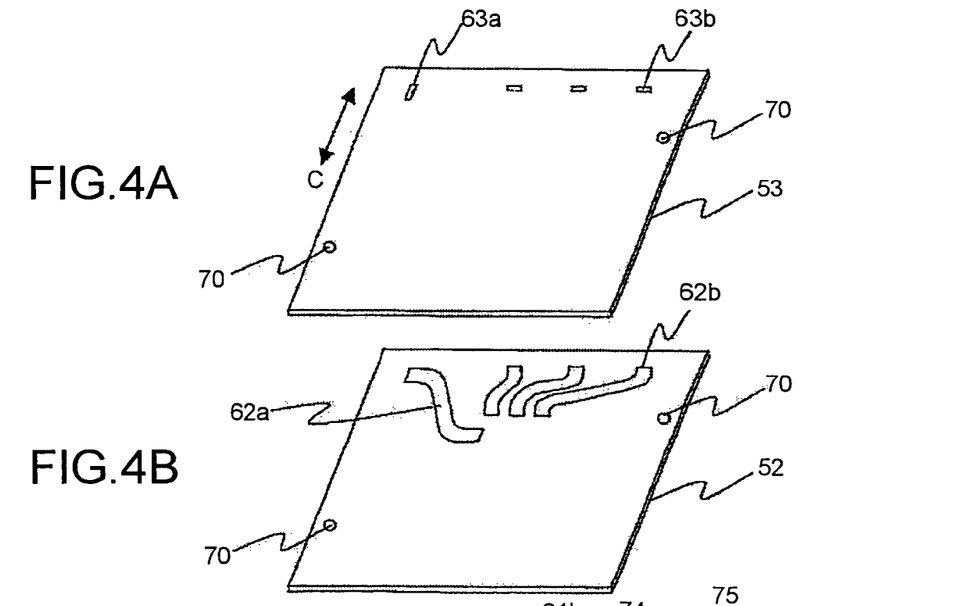
FIGS. 4A to 4D are perspective views of a structure of each plate constituting an antenna of the high-frequency module according to the embodiment of the present invention.

The end of the trench 642 of the power-supply waveguide trench 64a is connected to the power supply slot 63a. In the example of FIG. 4A, one power supply slot 63a (corresponding to one transmission channel) is laid out so that the opening direction (longitudinal direction) of the power supply slot 63a becomes parallel with the pipe axis direction C. The ends of the trenches 646 of the power-supply waveguide trenches 64b are connected to the power supply slots 63b. In the example of FIG. 4A, three power supply slots 63b (corresponding to three reception channels) are laid out so that the opening direction (longitudinal direction) of the power supply slots 63b becomes orthogonal with the pipe axis direction C.

The power supply slots 63a are connected to one end of a waveguide trench 62a. The power supply slots 63b are connected to one end of a waveguide trench 62b. The waveguide trenches 62a and 62b are formed with trenches to pierce through the waveguide plate 52. Plural power supply slots 63b are available, and each power supply slot 63b is connected to each waveguide trench 62b. In the example of FIG. 4B, one waveguide trench 62a and three waveguide trenches 62b are provided, and the trenches are formed in a smooth curved shape. One end of each of the waveguide trenches 62a and 62b is laid out on the outer periphery of the waveguide plate, and the other end of each trench is laid out to gather at the center of the plate. An interval larger than a certain size is provided to form isolation between adjacent trenches of the waveguide trenches 62a and 62b to avoid occurrence of interference.

Figure 4C:
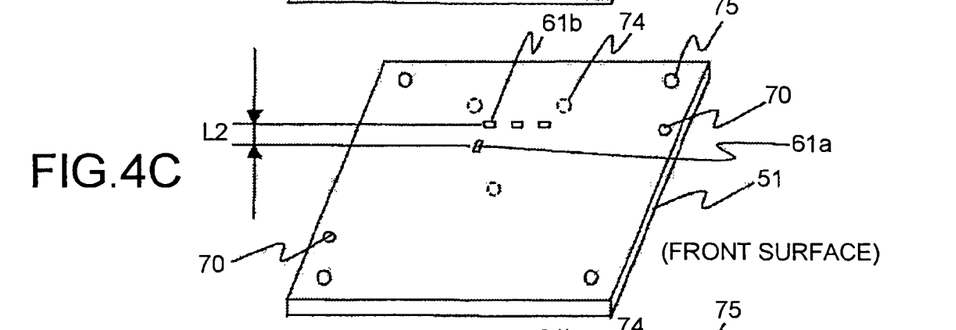
Figure 4D:
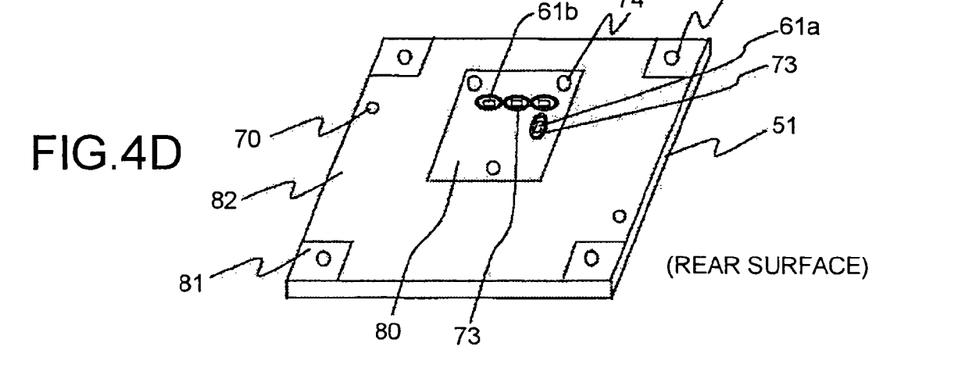

FIG. 4C depicts the front surface of the first waveguide plate 51 in contact with the second waveguide plate 52, and FIG. 4D depicts the rear surface of the first waveguide plate 51 in contact with the resin substrate. The other end of the waveguide trench 62a is connected to the waveguide 61a having a rectangular opening. The other end of the waveguide trench 62b is connected to the waveguide 61b having a rectangular opening. The rear surface of the first waveguide plate 51 is provided with a choke trench 73 and screw holes (male screws) 74 and 75 laid out around each of the waveguides 61a and 61b. L2 denotes an interval between the waveguides 61a and 61b.

In the example of FIG. 4D, three screw holes 74 are laid out around each of the waveguides 61a and 61b. Four screw holes 75 in total are laid out at each of four corners of the first waveguide plate 51. A contact surface 80 provided around each of the waveguides 61a and 61b is milled (surface ground) to have high surface coarseness precision. Because the screw holes 74 are provided around each of the waveguides 61a and 61b, the contact surface of the waveguide 39 of the resin substrate 4 and that of the waveguide 61 of the antenna 5 are contacted more closely. It is needless to mention that the number and the layout of the screw holes are not limited to the example.

A fitting surface 81 is provided around each screw hole 75. The contact surface 80 and the fitting surface 81 have the same heights. The other surface 82 of the rear surface of the first waveguide plate 51 has a plane surface slightly lower than the contact surface 80 and the fitting surface 81. When a desired isolation characteristic is obtained by the choke trenches 73 of the waveguides 61a and 61b, it is needless to mention that the total rear surface of the first waveguide plate 51 has the same height. In this case, molding of the contact surface 80 and the fitting surface 81 by milling (e.g., cutting and grinding) is not necessary.

Because the antenna 5 is configured as described above, a high-frequency signal input to and output from the waveguide 61 of the antenna 5 is connected to the radiation slots 10 and 11 via the waveguide 41 and the power supply waveguide configured inside the antenna 5. Regarding the high-frequency signal connected to the radiation slots 10 and 11, the radiation slot 10 transmits a wave, and the radiation slot 11 receives the wave.

A method of connecting the antenna 5 is explained. The first waveguide plate 51, the second waveguide plate 52, the power supply plate 53, the power-supply waveguide plate 54, the power-supply slot plate 55, the radiation waveguide plate 56, and the slot plate 57 use a thin stainless steel plates as their materials.

First, the first waveguide plate 51, the second waveguide plate 52, the power supply plate 53, the power-supply waveguide plate 54, the power-supply slot plate 55, the radiation waveguide plate 56, and the slot plate 57 are prepared by having a thin plate processed in a desired shape to form a waveguide, a waveguide trench, and an opening (the waveguide 61, the waveguide trench 62, the waveguide opening 63, the power-supply waveguide trench 64, the power supply slot 65, the radiation waveguide trench 66, the radiation slots 10 and 11, the contact surface 82, the fitting surface 81, the choke trench 73, and the screw holes 74 and 75), and they are sequentially laminated from the bottom above. In laminating, positioning pins are inserted into the two reference holes 70 provided on each plate. With this arrangement, the waveguide, the waveguide trench, and the opening of each plate can be accurately positioned. A desired processing shape of each plate can be processed by forming the same shape in the plate thickness direction. Therefore, each plate is processed in a desired shape, by punching of pressing a mold vertically to the plate surface, water-jet process of injecting pressured water flow vertically to the plate surface, and wire-cut discharge process. Therefore, each plate can be processed at low cost by a large amount. It is needless to mention that the processing methods are not limited to the above.

Next, after laminating each plate, the connection surfaces of the plates are pressed equally by mounting weight from above the plates and by applying pressures with the pressing tool and the pressing machine. In the state that each plate is pressurized, the laminated antenna is put into the heating furnace, thereby heating the whole antenna at a predetermined temperature at which the connection surfaces can be diffusion bonded in the solid phase. With this arrangement, the connection surfaces of the contacted plates are connected, thereby integrally connecting the antenna 5.

For example, when the antenna is heated for about 10 hours at 1000° C. in a suitably pressurized state, the first waveguide plate 51, the second waveguide plate 52, the power supply plate 53, the power-supply waveguide plate 54, the power-supply slot plate 55, the radiation waveguide plate 56, and the slot plate 57 are fixed and integrated. Because the connection surfaces of the plates are substantially equally connected by the diffusion bonding, a gap between the connected plates can be eliminated. Therefore, interference between adjacent waveguides can be suppressed, and isolation characteristic between transmission channels or between reception channels can be improved.

An example that the waveguide interface unit 42 constituting the antenna 5 and the antenna unit 43 are integrally connected is explained above. As other example, the waveguide interface unit 42 and the antenna unit 43 can be separately diffusion bonded, and thereafter both can be fixed together by fastening by connection or with screws. However, in this case, a gap is formed between the connection surfaces of the waveguide interface unit 42 and the antenna unit 43. Therefore, a choke trench is required to be additionally provided between near different waveguides so that the waveguides do not interfere with each other. The connection surfaces need to be processed in high precision.

Therefore, integrating the waveguide interface unit 42 with the antenna unit 43 using the diffusion bonding can provide a simpler configuration than that when the waveguide interface unit 42 and the antenna unit 43 are connected as separate units, and can decrease production cost and improve isolation characteristic of waveguides.

Figure 5B:
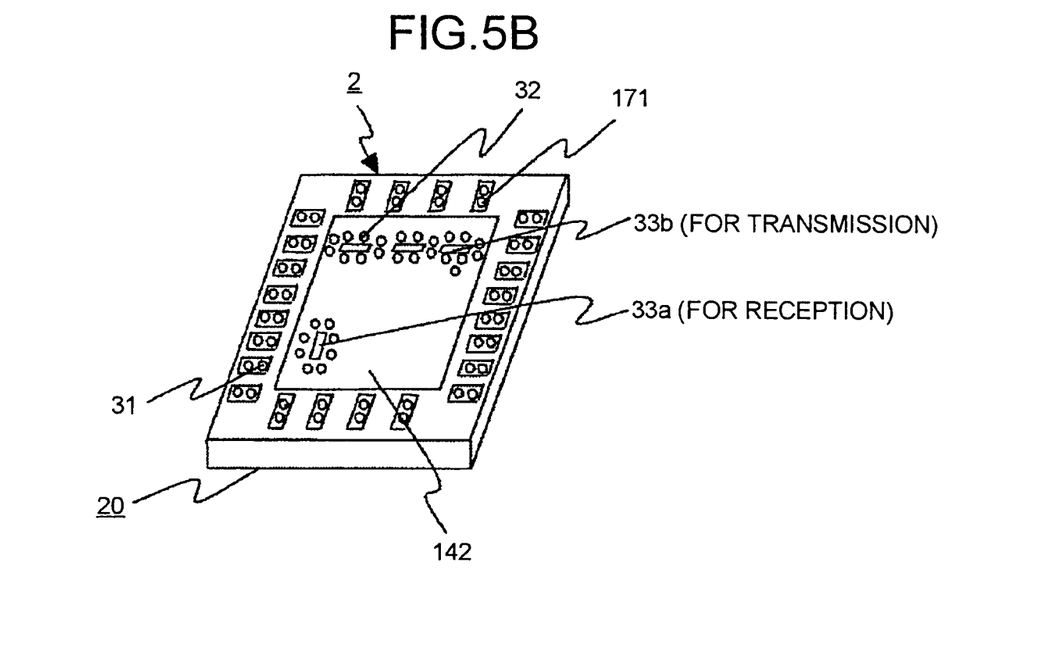
Figure 5C:
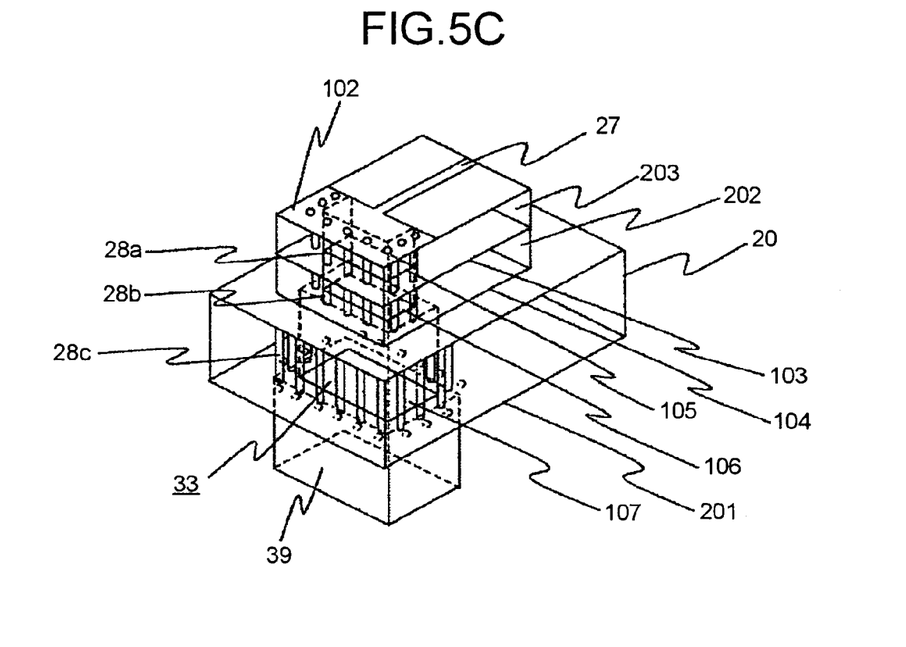
FIGS. 5C and 5D depict structures of each unit of the high-frequency package or the like according to the embodiment of the present invention.
Figure 5D:
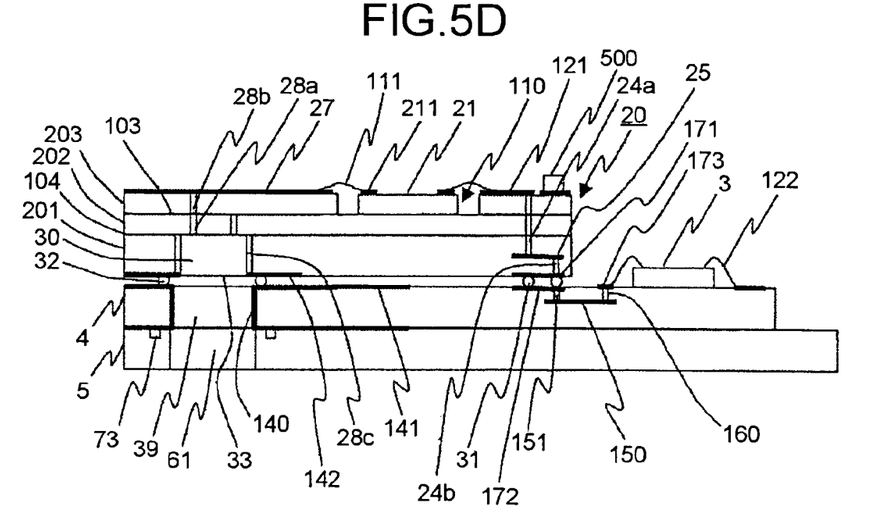
Figure 6:
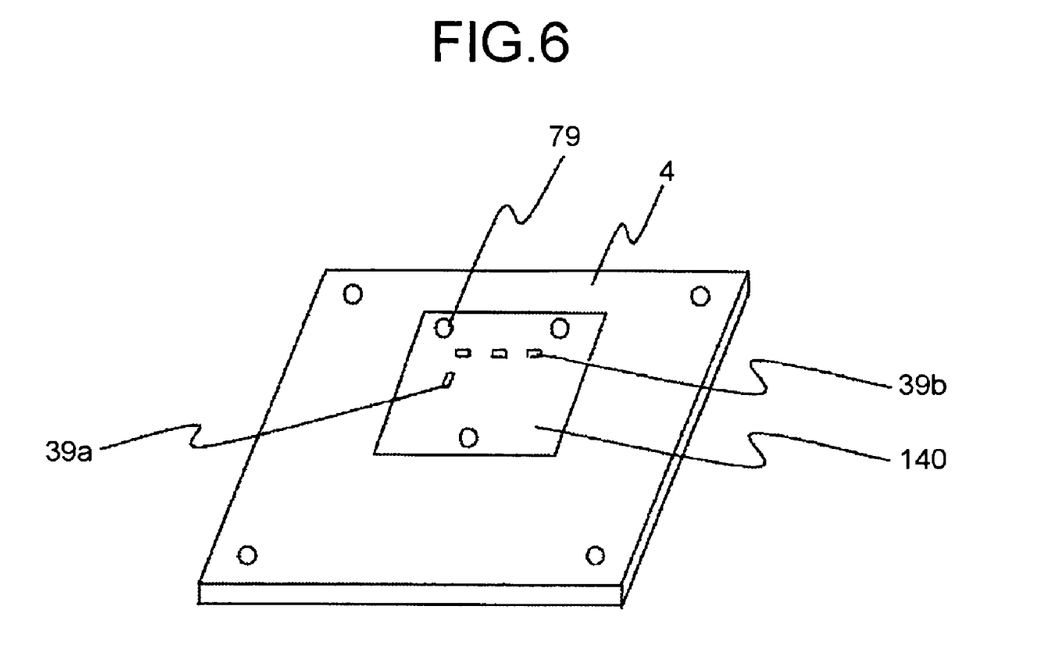
FIG. 6 is a perspective view of a configuration of a resin substrate according to the embodiment of the present invention.

Next, a connection structure between the waveguide terminals 33 and the semiconductor chip 21 in the high-frequency package 2 is described in detail below. FIG. 5A is an upper surface perspective view (a state that the lid unit 22 is removed) of a front surface of the high-frequency package 2, FIG. 5B is a lower surface perspective view of a rear surface of the high-frequency package 2, FIG. 5C is a part perspective view of a structure of a microstrip-line waveguide converter of the high-frequency package 2, and FIG. 5D is a part cross-sectional view of an inner structure of the high-frequency package 2. FIG. 6 is a perspective view of a rear surface side (a connection side with the antenna 5) of a configuration of the resin substrate 4.

FIGS. 5A to 5C, the semiconductor chip 21 is accommodated within the cavity 110 provided on the dielectric multilayer substrate 20. The dielectric multilayer substrate 20 is configured by laminating at least a dielectric multilayer substrate 201, a dielectric multilayer substrate 202, and a dielectric multilayer substrate 203. The seal ring 500 having an 8-shape (a shape that an outer frame is connected to the surrounding of an inner frame) having the lid unit (22) not shown connected on the upper surface by seam welding or the like is connected to the front surface of the upper layer of the dielectric multilayer substrate 20 by silver waxing or soldering. As shown in FIG. 6, the resin substrate 4 is formed with plural waveguides 39 (39a, 39b) and screw holes 79. The front layer of the resin substrate 4 is provided with a ground conductor layer 140 formed to surround the waveguide 39, and the waveguide 39 is grounded to the ground conductor layer 140. The ground conductor layer 140 at the rear surface side of the resin substrate 4 is closely adhered to the fitting surface 81 of the antenna 5.

The front layer (upper surface) of the dielectric multilayer substrate 203 is laid out with the above-described microstrip line 27 and a ground conductor 102. The microstrip line 27 can constitute a coplanar line by having a ground conductor laid out around, or can constitute a grounded coplanar line by having a ground conductor laid out with plural ground conductor vias and connected. One end of the microstrip line 27 is connected to a conductor terminal (pad) 211 provided on the semiconductor chip 21 via the conductive wire 111. The other end of the microstrip line 27 is integrally connected to the ground conductor 102.

A ground conductor 103 is provided on the lower surface of the dielectric multilayer substrate 203. The ground conductor 103 is provided with a rectangular opening 105. The ground conductor 102 is connected to the ground conductor 103 via plural ground conductor vias 28a at predetermined intervals (intervals equal to or smaller than a signal propagation wavelength $\lambda/4$ within the dielectric multilayer substrate). The ground conductor vias 28a are laid out in a U shape along the surrounding of three sides excluding one side at the microstrip line 27 side to surround the opening 105.

A ground conductor 104 is provided on the lower surface of the dielectric multilayer substrate 202. A rectangular opening 106 is formed on the ground conductor 104. The ground conductor 103 is connected to the ground conductor 104 via plural ground conductor vias 28b at predetermined intervals (intervals equal to or smaller than a signal propagation wavelength $\lambda/4$ within the dielectric multilayer substrate). The ground conductor vias 28b are laid out in a rectangular ring shape along the surrounding of the opening 106 to encircle the opening 106. The opening 106 is larger than the opening 105, and the ground conductor via 28a and the ground conductor via 28b are connected at a stage by sandwiching the ground conductor 103.

A ground conductor 142 is provided on the lower surface of the dielectric multilayer substrate 201. A rectangular opening 107 is formed on the ground conductor 142. The ground conductor 104 is connected to the ground conductor 142 via plural ground conductor vias 28c at predetermined intervals (intervals equal to or smaller than a signal propagation wavelength $\lambda/4$ within the dielectric multilayer substrate). The ground conductor vias 28c are laid out in a rectangular ring shape along the surrounding of the opening 107 to encircle the opening 107. The opening 107 is larger than the opening 106, and the ground conductor via 28b and the ground conductor via 28c are connected at a stage by sandwiching the ground conductor 104. The opening 107 of the dielectric multilayer substrate 201 constitutes waveguide terminals 33.

In the example of FIG. 5B, the waveguide terminals 33 are configured in the opening provided in the ground conductor 142 on the rear surface of the high-frequency package 2. Three reception waveguide terminals 33c and one transmission waveguide terminal 33a are provided as the waveguide terminals 33. As is clear from comparison with FIGS. 3A to 3D, each waveguide terminal 33 can be laid out at a quite different position from the positions and the intervals of the power supply slots 65 inside the antenna 5. In this case, the interval between the waveguide terminal 33a ad the waveguide terminal 33b can be set approximately the same as an interval L2 between the waveguide 61a and the waveguide 61b. The number and the laid out of the waveguide terminals 33 are not limited to this example.

As shown in FIG. 5C, the dielectric part encircled by the ground conductor via 28a, the ground conductor via 28b, and the ground conductor via 28c, and the openings 105, 106, and 107 constitute the dielectric waveguide 32. An impedance conversion is performed between the dielectric waveguide 30 and the microstrip line 27. The microstrip-line waveguide converter performs a conversion operation between the microstrip mode and the waveguide mode.

Accordingly, a milliwave-band high-frequency signal (transmission signal) output from the semiconductor chip 21 (21a) is transmitted to the dielectric waveguide 30 through the microstrip line 27, and is output from the waveguide terminal 33(33a). The high-frequency signal output from the waveguide terminal 33(33a) is input to the waveguide 61 of the antenna 5 through the waveguide 39 of the resin substrate 4. The high-frequency signal input to the waveguide 61 of the antenna 5 is electrically connected to the radiation slot 10 of the antenna 5 via each waveguide (the waveguide 61a, the waveguide trench 62a, the power-supply waveguide trench 64a, and the radiation waveguide trench 66a) inside the antenna 5 and the power supply slots (the power supply slot 63a, the power supply slot 65a), so that a transmission wave is radiated (output) from the radiation slot 10. The transmission wave output from the radiation slot 10 is reflected from a reflector reflecting the outer wave, and is reflected to the antenna 5.

The radiation slot 11 receives the reception wave returned to the antenna 5. The reception signal received by this radiation slot 11 is connected to the power supply slot 65b via the waveguide trench 66b of the antenna 5. The reception signal connected to the power supply slot 65b is input to the waveguide 61 via each waveguide (the power-supply waveguide trench 64b, the waveguide trench 62b, and the waveguide 61b) inside the antenna 5 and the power supply slot 63b. The reception signal input to the waveguide 61 is input to the waveguide terminal 33 through the waveguide 39 of the resin substrate 4. The reception signal (high-frequency signal) input to the waveguide terminal 33 is transmitted to the microstrip line 27 by the dielectric waveguide 30, and is input to the semiconductor chip 21 (21b).

As described in FIG. 5A, the transmission semiconductor chip 21a that outputs a transmission signal and the reception semiconductor chip 21b that receives an input reception signal are accommodated in different cavity spaces 800a and 800b, respectively. An intermediate frame of the seal ring 500 is set between the cavity spaces 800a and 800b so that there is not wave interference therebetween. Therefore, isolation is secured between the semiconductor chips 21a and 21b.

As shown in FIG. 5D, the waveguide terminals 33 are connected to the waveguide 39 of the resin substrate 4 via the plural conductive connection members 32 laid out in a ring shape as described above. The resin substrate 4 is brought into contact with the antenna 5, and the waveguide 39 is connected to the waveguide 61 as described above. The waveguide 39 of the resin substrate 4 is provided with the ground conductor layer 140 on the inner periphery of the opening of the waveguide 39 as described above. The ground conductive layer 140 is connected to a ground conductive layer 141 provided on the upper and lower surfaces of the resin substrate 140 on the periphery of the opening of the waveguide 39. The ground conductive layer 141 is connected to the ground conductive layer 142 on the lower surface of the dielectric multilayer substrate 201 via the conductive connection members 32 as described above.

The resin substrate 4 and the antenna 5 are fastened and are brought into close contact with each other by crews as described above. In this case, a gap is generated between the resin substrate 4 and the antenna 5 on the connection surface of the resins substrate 4 and the antenna 5 excluding the periphery of the fastened part. When the gap is large, a signal leakage occurs at the connection part between the waveguide 39 and the waveguide 61. However, because the choke trench 73 is provided on the upper surface (rear surface) of the antenna 5, a short surface is electrically formed, and the signal leakage between the waveguide 39 and the waveguide 61 is suppressed. The choke trench 73 is separated from the waveguide 61 with a signal propagation wavelength $\lambda/4$ within the free space, and has a depth of a signal propagation wavelength $\lambda/4$ within the free space.

As shown in FIG. 5D, the high-frequency package 2 has a signal transmission path for transmitting and receiving an electric signal to and from the resin substrate 4. The signal transmission path is connected to a waveguide via 24a and the conductor strip line (signal line) 25 of the substrate inner layer, in the inner layer of the dielectric multilayer substrate of the high-frequency package 2.

The conductor via 24a is connected to a conductor via 24b in the inner layer of the substrate via the conductor strip line 25 in the inner layer of the substrate. Each conductor via 24b is connected to a conductor terminal 171 provided on the outer periphery of the lower surface of the high-frequency package 2. As shown in FIG. 5B, the conductor terminals 171 are connected in parallel to plural (two rows in the example shown in FIG. 5B conductive connection members 31 laid out on the outer periphery of the high-frequency package 2. That is, two conductive connection members 31 connected to one conductor terminal 171 are connected in parallel and pass the same signal.

The conductive connection members 31 are connected to a conductor terminal 172 provided on the front surface of the resin substrate 4. Accordingly plural rows of the conductive connection members 31 connected to the outer periphery of the high-frequency package 2 are connected to each other in parallel. Therefore, even when the conductive connection members 31 provided at the outermost side of the high-frequency package 2 are disconnected, a disconnection of a signal between the resin substrate 4 and the high-frequency package 2 can be prevented when the conductive connection members 31 connected in parallel to the inside of the high-frequency package 2 are not disconnected.

The conductor terminal 172 is connected to a conductor via 151 in the inner layer of the resin substrate and is connected to a conductor line 150 in the inner layer of the substrate. The conductor line 150 is connected to a conductor terminal 173 of the front layer of the resin substrate 4 via a conductor via 160 in the inner layer of the substrate. The conductor terminal 173 is connected to a conductor terminal of the electronic part 3 via a conductive member (lead) 122. That is, the resin substrate 4 and the high-frequency package 2 are electrically connected to each other via plural conductive connection members 31 connected to the outermost side of the high-frequency package 2.

Accordingly, the semiconductor chip 21 within the high-frequency package 2 and the electronic part 3 on the resin substrate 4 can transmit low-frequency electric signals such as a control signal, a monitor signal, a video signal, and a power supply bias, with each other.

As explained above, the present embodiment includes: a slot plate having plural radiation slots laid out in inclination; a radiation waveguide plate formed with plural rows of waveguide trenches having radiation slots laid out in respective pipe axis directions; a power-supply slot plate formed with plural power supply slots brought into contact with the radiation waveguide plate and connected to respective waveguide trenches; a power-supply waveguide plate formed with plural waveguides brought into contact with the power-supply slot plate and connected to respective power supply slots; and a power supply plate formed with plural waveguide openings brought into contact with the power-supply waveguide plate and connected to respective waveguides. The plates are diffusion bonded to configure an integrally connected antenna (slot antenna). The embodiment further includes: a resin substrate fixed to the front surface of the power supply plate of the antenna, having plural waveguide openings communicated to respective waveguide openings of the antenna, and mounted with conductor terminals, ground conductors, and electronic parts; and a high-frequency package having a dielectric substrate mounted with a high-frequency semiconductor element, and a lid unit accommodating the dielectric substrate and the high-frequency semiconductor element, and connected to a resin substrate via plural conductive connection members. Further, the high-frequency package has a waveguide terminal formed with a dielectric opening in a ground conductor, a conductor terminal, and a ground conductor, at the outside of the package, having the waveguide terminal and a high-frequency signal terminal of a high-frequency semiconductor element connected to each other via a dielectric waveguide, and having a waveguide terminal of the high-frequency package and a waveguide opening of the resin substrate laid out to face each other. Plural conductive connection members are laid out to surround the waveguide terminal of the high-frequency package and the waveguide opening of the resin substrate. The conductor terminal of the high-frequency package, the ground conductor, the conductor terminal of the resin substrate, and the ground conductor are connected.

That is, plural thin plates having openings are integrally connected by diffusion bonding, thereby constituting waveguides laid out within the antenna. With this arrangement, the radiation slot of the slot antenna and the waveguide terminal of the frequency package can be connected with low loss. Therefore, there are the following effects.

By connecting plural plates by diffusion bonding, the antenna 5 constituting a slot antenna is integrally configured. With this arrangement, plural waveguides 41 and power supply waveguides connected to the radiation slot and having a complex shape can be configured within the antenna 5 at low cost. By connecting the configured antenna 5 to the waveguide terminal 33 of the milliwave-band high-frequency package 2 having a small substrate size, an interval between adjacent waveguides can be taken longer at the radiation slot side than an interval between adjacent waveguide terminals 33, and the waveguides can be laid out in a desired shape and at free positions. For example, the interval L2 in FIGS. 4A to 4D can be made smaller than the interval L1 in FIGS. 1A and 1B. The power supply slot 65 in FIG. 3 and the waveguide terminal in FIG. 5 can be laid out at positions in different in-plane directions of the substrate. Therefore, the radiation slot of the antenna 5 and the dielectric waveguide 30 within the high-frequency package 2 can be easily connected with the waveguide 41 by sandwiching the resin substrate 4 therebetween. As a result, the high-frequency module 1 can be produced at low cost.

Further, because the slot plates; the waveguide plates, and the power supply plates are integrally connected to form the antenna, the resin substrate (organic substrate) having a high-frequency package waxed (BGA connection) and the antenna can be directly connected to each other via both waveguide terminal. The connection structure can be made thinner. For example, conventionally, in connecting the antenna and the resin substrate to each other, a waveguide plate (waveguide adapter) having a waveguide laid out inside needs to be connected between the antenna and the resin substrate by sandwiching the waveguide plate, and a waveguide interface needs to be taken between the antenna and the resin substrate by fixing the antenna, the waveguide plate, and the resin substrate with screws. In this case, a plate material A having a waveguide trench configured by milling and a plate material B having a waveguide opening need to be superimposed with each other to configure a waveguide adapter. The trench of the plate material A is formed by milling, and a cavity is provided in the waveguide corner to align the waveguide corner (for example, see Japanese Patent Application Laid-open No. 2004-172688). Therefore, it has been difficult to decrease the thickness of the waveguide adapter.

However, in the present embodiment, because the waveguides can be integrally incorporated in the antenna, a waveguide adapter is not necessary. Because a stepped surface can be configured in the waveguide corner by forming holes in thin plates and by integrally connecting the plural thin plates by diffusion bonding, no cavity is left in the waveguide corner, and the thickness required for the layout of the waveguide can be decreased. By forming the antenna using thin plates by diffusion bonding, a waveguide can be configured having a size that a height ratio of an E surface to an H surface of a waveguide cross section is smaller than a normal 1:2 (for example, a height ratio of the E surface to the H surface is equal to 1:2 to 1:1.16), without a constraint of a waveguide trench depth based on the milling. Therefore, the antenna can be made thinner than that when a waveguide adapter is used. For example, a thin antenna having a waveguide interface can be configured to have a thickness half of that when the waveguide adapter is used.

A waveguide terminal of the high-frequency package 2 can be easily connected to a waveguide of the resin substrate 4 by connecting the resin substrate 4 to the high-frequency package 2 using plural conductive connection members 31 and 32 (ball grid array). Further, a conductor terminal of the high-frequency package 2 can be easily connected to a conductor terminal of the resin substrate 4. Accordingly, low-frequency electric signals such as a control signal, a monitor signal, a video signal, and a power supply bias can be transmitted between the high-frequency package 2 and the resin substrate 4 while simultaneously transmitting a high-frequency signal from the high-frequency package 2 to the waveguide 39 of the resin substrate 4.

Because the waveguide of the resin substrate 4 and the waveguide terminal of the high-frequency package 2 are integrally connected with plural conductive connection members 32, and because the antenna 5 integrally constitutes the waveguide, the waveguides are isolated on only the connection surface of the waveguide of the resin substrate 4 and the waveguide of the antenna 5, between the waveguide terminal of the high-frequency package 2 and the radiation slot. Therefore, a place having a possibility of a signal leakage in the connection part of the waveguide becomes only the connection surface between the waveguide of the resin substrate 4 and the waveguide of the antenna 5. Therefore, it is sufficient that a choke trench is provided around the waveguide on only the connection surface. Accordingly, the choke trench becomes minimum necessary, and the processing cost can be suppressed and a leakage signal can be decreased.

The waveguide 41 is constituted in the inside of the antenna 5, so that air of a specific inductive capacity of one (1) flows. Therefore, the dielectric loss becomes remarkably small. Accordingly, a high-frequency signal of a milliwave band input to and output from the waveguide terminal 33 of the high-frequency package 2 can be input and output between the radiation slots 10 and 11 with remarkably high efficiency via the waveguide 41 and with low loss.

When the high-frequency package 2 is connected onto the resin substrate 4 using the conductive connection members 31 and 32, with the resin substrate 4 present between the antenna 5 of a stainless material and the high-frequency package 2 of a ceramic material, thermal stress generated due to the difference between thermal expansion coefficients of the members can be mitigated. Accordingly, mechanical strength of the high-frequency package 2 can be improved, and a crack and a peeling off of the connection surface generated in the high-frequency package 2 can be suppressed.

When the conductor terminal at the outermost periphery of the high-frequency package is connected to the conductor terminal of the resin substrate using plural conductive connection members laid out in a ring shape, even if the connection between the conductive connection member and the conductor terminal of the high-frequency package is disconnected, the disconnection state can be easily confirmed by visual inspection. Therefore, the connection and conduction test of the resin substrate and the high-frequency package becomes easy, and connection reliability of products can be improved.

Further, when the conductor terminals at the outermost periphery of the high-frequency package 2 are connected in parallel using plural rows of conductive connection members laid out in a ring shape, even if the conductive connection members at the outermost side are peeled off, conduction between the conductor terminal of the high-frequency package 2 and the conductor terminal of the resin substrate is maintained when the parallel-connected inside conductive connection members are not peeled off. Therefore, connection reliability of the conductive connection members can be improved.

INDUSTRIAL APPLICABILITY

The high-frequency module having the antenna according to the present embodiment can be suitably applied to a milliwave-radio communication device and a milliwave radar that input and output milliwave-band high-frequency signals.

The invention claimed is:

1. A high-frequency module comprising:
a slot antenna including a slot plate laid out with a plurality of radiation slots, a radiation waveguide plate in contact with the slot plate and formed with a plurality of rows of waveguide trenches having layout directions of the plurality of radiation slots set in respective pipe axis directions, a power-supply slot plate in contact with the radiation waveguide plate and formed with a plurality of power supply slots connected to the plurality of rows of waveguide trenches, a power-supply waveguide plate in contact with the power-supply slot plate and formed with a plurality of waveguides connected to the plurality of power-supply slots, and a power supply plate in contact with the power-supply waveguide plate and formed with a first plurality of waveguide openings connected to the plurality of waveguides, and having the slot plate, the radiation waveguide plate, the power-supply slot plate, the power-supply waveguide plate, and the power supply plate integrally connected to configure the slot antenna;
a resin substrate fixed to a surface of the power-supply plate of the antenna, having a second plurality of waveguide openings communicated to the first plurality of waveguide openings of the antenna, and mounted with conductor terminals, ground conductors, and electronic parts; and
a high-frequency package including a dielectric substrate mounted with a high-frequency semiconductor element, and a lid unit accommodating the dielectric substrate and the high-frequency semiconductor element, and connected to the resin substrate via a plurality of conductive connection members, wherein
the high-frequency package includes a conductor terminal, a ground conductor, and a waveguide terminal formed with a dielectric opening in the ground conductor, at an outside of the package, the waveguide terminal and a high-frequency signal terminal of the high-frequency semiconductor element being connected to each other via a dielectric waveguide,
the waveguide terminal of the high-frequency package and a waveguide opening of the second plurality of waveguide openings of the resin substrate are laid out to face each other, and
the plurality of conductive connection members include (1) first conductive connection members that are laid out to surround the waveguide terminal of the high-frequency package and the second plurality of waveguide openings of the resin substrate, and (2) second conductive connection members that are laid out at locations different from those of the first conductive connection members and connect the conductor terminal and the ground conductor of the high-frequency package to at least one of the conductor terminals and at least one of the ground conductors of the resin substrate respectively.

2. The high-frequency module according to claim 1, wherein low-frequency signals or control signals, power sources, or video signals are input to and output from the second conductive connection members laid out in a ring shape along the outer periphery of the high-frequency package.

3. The slot antenna according to claim 1, wherein the slot plate, the radiation waveguide plate, the power-supply slot plate, the power-supply waveguide plate, and the power supply plate are integrally connected through diffusion bonding.

4. A high-frequency module comprising:
a slot antenna including a slot plate laid out with a plurality of radiation slots, a radiation waveguide plate in contact with the slot plate and formed with a plurality of rows of waveguide trenches having layout directions of the plurality of radiation slots set in respective pipe axis directions, a power-supply slot plate in contact with the radiation waveguide plate and formed with a plurality of power supply slots connected to the plurality of rows of waveguide trenches, a power-supply waveguide plate in contact with the power-supply slot plate and formed with a plurality of waveguides connected to the power-supply slots, and a power supply plate in contact with the power-supply waveguide plate and formed with a first plurality of waveguide openings connected to the plurality of waveguides, the slot antenna being configured by integrally connecting the slot plate, the radiation waveguide plate, the power-supply slot plate, the power-supply waveguide plate, and the power supply plate;
a waveguide plate having a first side thereof closely fixed to a front surface of the power supply plate of the slot antenna, and having a plurality of waveguides communicating with the waveguide openings of the slot antenna;
a resin substrate fixed to a second side of the waveguide plate, having a second plurality of waveguide openings communicated with the plurality of waveguides of the waveguide plate, and mounted with conductor terminals, ground conductors, and electronic parts; and
a high-frequency package including a dielectric substrate mounted with a high-frequency semiconductor element, and a lid unit accommodating the dielectric substrate and the high-frequency semiconductor element, and connected to the resin substrate via a plurality of conductive connection members, wherein
the high-frequency package includes a conductor terminal, a ground conductor, and a waveguide terminal formed with a dielectric opening in the ground conductor, at an outside of the package, and has the waveguide terminal and a high-frequency signal terminal of the high-frequency semiconductor element connected to each other via a dielectric waveguide, the waveguide terminal of the high-frequency package and a waveguide opening of the second plurality of waveguide openings of the resin substrate are laid out to face each other, and the plurality of conductive connection members include (1) first conductive connection members that are laid out to surround the waveguide terminal of the high-frequency package and the second plurality of waveguide openings of the resin substrate, and (2) second conductive connection members that are laid out at locations different from those of the first conductive connection members and connect the conductor terminal and the ground conductor of the high-frequency package to at least one of the conductor terminals and at least one of the ground conductors of the resin substrate respectively.

5. The high-frequency module according to claim 4, wherein low-frequency signals or control signals, power sources, or video signals are input to and output from the second conductive connection members laid out in a ring shape along the outer periphery of the high-frequency package.

* * * * *